United States Patent
Das et al.

(10) Patent No.: US 9,455,356 B2
(45) Date of Patent: Sep. 27, 2016

(54) HIGH POWER SILICON CARBIDE (SIC) PIN DIODES HAVING LOW FORWARD VOLTAGE DROPS

(75) Inventors: Mrinal Das, Durham, NC (US); Brett Hull, Raleigh, NC (US); Joseph Sumakeris, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/363,800

(22) Filed: Feb. 28, 2006

(65) Prior Publication Data

US 2007/0200115 A1 Aug. 30, 2007

(51) Int. Cl.
H01L 29/868 (2006.01)
H01L 29/16 (2006.01)
H01L 29/66 (2006.01)

(52) U.S. Cl.
CPC ......... *H01L 29/868* (2013.01); *H01L 29/1608* (2013.01); *H01L 29/6606* (2013.01)

(58) Field of Classification Search
CPC ............... H01L 2924/00; H01L 2924/00014; H01L 2224/48227; H01L 2224/48465; H01L 2224/48091
USPC ........................................................ 257/77
See application file for complete search history.

(56) References Cited

U.S. PATENT DOCUMENTS

| | | | | |
|---|---|---|---|---|
| 7,488,973 B2* | 2/2009 | Sugawara | ........................ | 257/40 |
| 2005/0064723 A1 | 3/2005 | Sumakeris | | |
| 2007/0090370 A1* | 4/2007 | Nakayama et al. | ............ | 257/77 |
| 2007/0170436 A1* | 7/2007 | Sugawara | ........................ | 257/77 |

FOREIGN PATENT DOCUMENTS

| | | | | |
|---|---|---|---|---|
| JP | WO 2005/055323 | * | 6/2005 | |
| WO | WO 2005/076369 | * | 8/2005 | ........................ 257/77 |

OTHER PUBLICATIONS

NPL document filed in Dec. 13, 2010 Lendenmann et al. [Materials Science Forum vol. 389-393 (2002) pp. 1259-1264].*
Das et al., "Ultra High Power 10 kV, 50 A SiC PiN Diodes," *Proceedings of the 17th International Symposium on Power Semiconductor Devices & IC's*, May 23-26, Santa Barbara, CA.
Levinshtein et al., "High-temperature (up to 773 K) operation of 6-kV 4H-SiC junction diodes," *Solid State Electronics*, vol. 49, No. 7, Jul. 2005, p. 1228-1232.
International Search Report and Written Opinion of the International Searching Authority corresponding to PCT/US2006/044138, mailed May 9, 2007.
Agarwal et al., "A 1cm×1cm, 5kV, 100A, 4H-SiC Thyristor Chip for High Current Modules," from the proceeding of the International Conference on Silicon Carbide and Related Materials (ICSCRM), Pittsburgh, PA (Sep. 2005), published in *Materials Science Forum*, vols. 527-529, pp. 1397-1400 (2006).
Das et al., "Latest Advances in High Voltage, Drift Free, 4H-SiC PiN Diodes," *Semiconductor Device Research Symposium*, pp. 364-365 (2003).

(Continued)

*Primary Examiner* — Tony Tran
(74) *Attorney, Agent, or Firm* — Myers Bigel & Sibley

(57) ABSTRACT

Silicon Carbide (SiC) PiN Diodes are provided having a reverse blocking voltage ($V_R$) from about 3.0 kV to about 10.0 kV and a forward voltage ($V_F$) of less than about 4.3 V.

26 Claims, 9 Drawing Sheets

(56) References Cited

OTHER PUBLICATIONS

Das et al., "Evolution of Drift-Free, High Power 4H-SiC PiN Diodes," from the proceeding of the International Conference on Silicon Carbide and Related Materials (ICSCRM), Pittsburgh, PA (Sep. 2005), published in *Materials Science Forum*, vols. 527-529, pp. 1329-1334 (2006).

Hull et al., "Drift-Free 10-kV, 20-A 4H-SiC PiN Diodes," *Journal of Electronic Materials*, vol. 34, No. 4, pp. 341-344 (2005).

Lendenmann et al., "Long Term Operation of 4.5kV PiN and 2.5kV JBS Diodes," *Materials Science Forum*, vols. 353-356, pp. 727-730 (2001).

Lendenmann et al., "High-Power SiC Diodes: Characteristics, Reliability and Relation to Material Defects," *Materials Science Forum*, vols. 389-393, pp. 1259-1264 (2002).

Levinshtein et al., "High-temperature (up to 773 K) operation of 6-kV 4H-SiC junction diodes," *Solid-State Electronics*, vol. 49, Issue 7, pp. 1228-1232 (Jul. 2005).

Mohney et al., "Morphological study of the Al—Ti ohmic contact to p-type SiC," *Solid-State Electronics*, vol. 46, pp. 289-293 (2002).

Sumakeris et al., "Approaches to Stabilizing the Forward Voltage of Bipolar SiC Devices," *Materials Science Forum*, vols. 457-460, pp. 1113-1116 (2004).

Sumakeris et al., "Techniques for Minimizing the Basal Plane Dislocation Density in SiC Epilayers to Reduce $V_f$ Drift in SiC Bipolar Power Devices," from the proceeding of the International Conference on Silicon Carbide and Related Materials (ICSCRM), Pittsburgh, PA (Sep. 2005), published in *Materials Science Forum*, vols. 527-529, pp. 141-146 (2006).

Tantraporn et al., "Multiple-Zone Single-Mask Junction Termination Extension—A High-Yield Near-Ideal Breakdown Voltage Technology," *IEEE Transactions on Electron Devices*, vol. ED-34, No. 10, pp. 2200-2210 (Oct. 1987).

\* cited by examiner

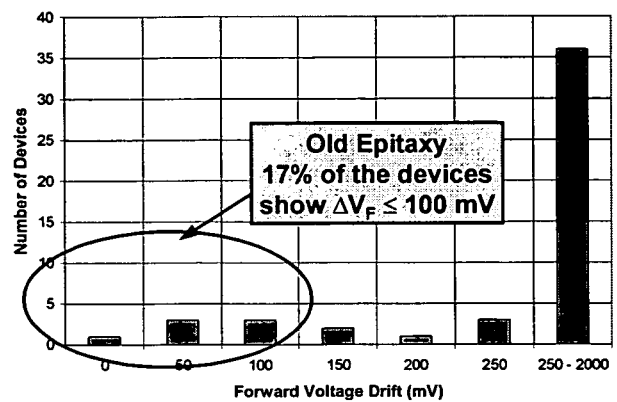
Figure
8A
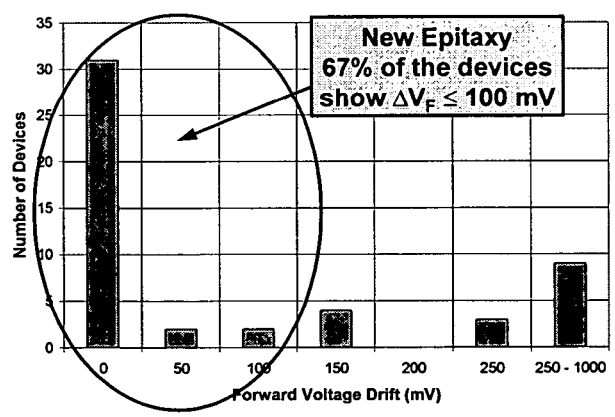
Figure
8B

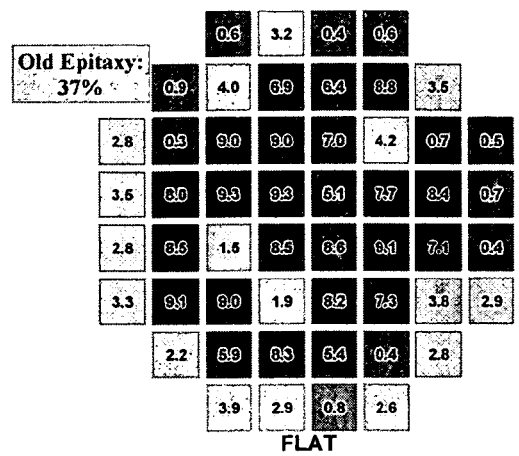
Figure
9A
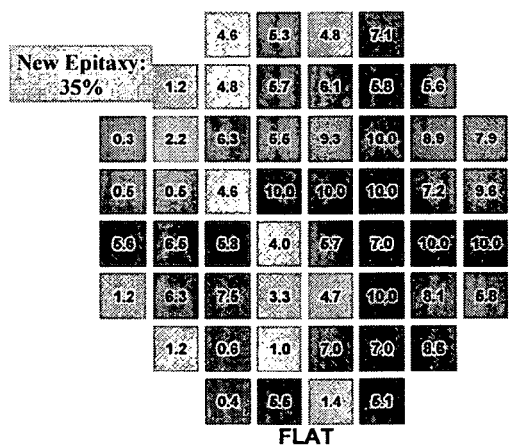
Figure
9B

HIGH POWER SILICON CARBIDE (SIC) PIN DIODES HAVING LOW FORWARD VOLTAGE DROPS

STATEMENT OF GOVERNMENT INTEREST

The present invention was developed with Government support under contract numbers N00014-02-C-D302, N00014-05-C-0202 and W9111NF-04-2-0021. The Government has certain rights in this invention.

FIELD OF THE INVENTION

The present invention relates to semiconductor devices and, more particularly, to PiN Diodes.

BACKGROUND OF THE INVENTION

In recent years, advances have been made in the development of silicon carbide (SiC) PiN diodes. For example, 4H—SiC PiN diodes may have the capability to block in excess of 20 kV while maintaining a low forward voltage ($V_F$) of 6.3 V at 3.2 A (100 A/cm$^2$) as discussed in LATEST ADVANCES IN 4H—SIC PIN AND MOS POWER DEVICES by M. K. Das (*Digest of International Semiconductor Device Research Symposium*, Washington, D.C., 2003). However, these SiC PiN diodes suffer from an increase in $V_F$ under forward bias as discussed in a paper by H. Lendenmann et al. (*Mater. Sci. Forum*, 353-356, 727 (2001). Furthermore, technological issues like, for example, effective edge termination, low resistivity p-type ohmic contacts, and forward voltage stability have historically hampered PiN diode development as discussed in, for example, papers by Crofton et al. (*Solid-State Electron.*, vol. 46, p. 689, 2002), H. Lendenmann et al. (*Mater. Sci. Forum*, Vol. 389-393 p. 1259, 2002) and J. Sumakeris, et al. (*Mater. Sci. Forum*, vol. 457-460, p. 1113, 2004).

SUMMARY OF THE INVENTION

Some embodiments of the present invention Silicon Carbide (SiC) PiN Diodes having a reverse blocking voltage ($V_R$) from about 3.0 kV to about 10.0 kV and a forward voltage ($V_F$) of less than about 4.3 V.

In further embodiments of the present invention, the PiN diodes may have an average forward current ($I_F$) of not greater than about 420 A. In some embodiments of the present invention, the PiN diodes may have an average forward current ($I_F$) of not greater than about 200 A. In certain embodiments of the present invention, the PiN diode may be operating at a temperature of from about 25° C. to about 530° C.

In still further embodiments of the present invention, the SiC PiN Diode may have a $V_R$ of about 10.0 kV, an average $I_F$ of about 50 A, a reverse leakage current ($I_R$) of about 0.5 mA, a $V_F$ of about 3.8 V, a reverse recovery time ($t_{rr}$) of about 150 nsec and a reverse recovery charge ($Q_{rr}$) of about 1.1 μC when operating at a temperature of about 25° C.

In some embodiments of the present invention, the SiC PiN Diode may have a blocking voltage ($V_R$) of about 10.0 kV, an average $I_F$ of about 50 A, a reverse recovery time ($t_{rr}$) of about 300 nsec and a reverse recovery charge ($Q_{rr}$) of about 1.6 μC when operating at a temperature of about 150° C.

In further embodiments of the present invention, the SiC PiN Diode may have a forward current of about 2 A. In these embodiments of the present invention, the SiC PiN Diode may be provided on a single chip, the chip being about 2.8 mm by 2.8 mm and the plurality of SiC PiN diodes may have a $V_F$ of less than about 4.0 V, no less than about seventy percent of the plurality of SiC PiN diodes may have a blocking voltage of about 6 kV and a reverse leakage current ($I_R$) of not greater than 1.0 mA/cm$^2$ and almost all of the plurality of SiC PiN diodes may have a forward voltage drift of no greater than 0.1V. The SiC PiN Diode may have a total yield of no less than about seventy percent.

In still further embodiments of the present invention, the SiC PiN Diode may have a forward current of about 5 A. In these embodiments of the present invention, a plurality of SiC PiN diodes may be provided on a single chip, the chip being about 2.8 mm by about 4.85 mm and the plurality of SiC PiN diodes may have a $V_F$ of less than about 4.0 V, no less than about seventy one percent of the plurality of SiC PiN diodes may have a blocking voltage of about 6 kV and a reverse leakage current ($I_R$) of not greater than 1.0 mA/cm$^2$ and no less than about ninety six percent of the plurality of SiC PiN diodes may have a forward voltage drift of no greater than 0.1V. The SiC PiN Diode may have a total yield of no less than about sixty five percent.

In some embodiments of the present invention, the SiC PiN Diode may have forward current of about 25 A. In these embodiments of the present invention, a plurality of SiC PiN diodes may be provided on a single chip, the chip being about 5.4 mm by 5.4 mm. The plurality of SiC PiN diodes may have a $V_F$ of less than about 4.0 V, no less than about fifty percent of the plurality of SiC PiN diodes may have a blocking voltage of about 6 kV and a reverse leakage current ($I_R$) of not greater than 1.0 mA/cm$^2$ and no less than about eighty seven percent of the plurality of SiC PiN diodes may have a forward voltage drift of no greater than 0.1 V. The chip may have a total yield of no less than about forty three percent.

In further embodiments of the present invention, the SiC PiN Diode may have a forward current of about 50 A. In these embodiments of the present invention, the plurality of SiC PiN diodes may be provided on a single chip, the chip being about 8.65 mm by about 8.55 mm and the plurality of SiC PiN diodes may have a $V_F$ of less than about 4.0 V, no less than about sixty five percent of the plurality of SiC PiN diodes may have a blocking voltage of about 6 kV and a reverse leakage current ($I_R$) of not greater than 1.0 mA/cm$^2$ and no less than about ninety six percent of the plurality of SiC PiN diodes may have a forward voltage drift of no greater than 0.1V. The chip may have a total yield of no less than about sixty three percent.

In some embodiments of the present invention, the SiC PiN Diode may be a 4H SiC PiN Diode. The SiC PiN Diode may further include an n-type SiC substrate, an n-type SiC drift layer on the n-type SiC substrate and a p-type SiC Anode injection layer on the n-type drift layer.

BRIEF DESCRIPTION OF THE DRAWINGS

FIGS. 8A and 8B are graphs of number of devices vs. forward voltage drift (mV) for two different types of epitaxy according to some embodiments of the present invention.

FIGS. 9A and 9B are reverse blocking wafermaps for different types of epitaxy according to some embodiments of the present invention.

DETAILED DESCRIPTION OF EMBODIMENTS OF THE INVENTION

Figure 1:
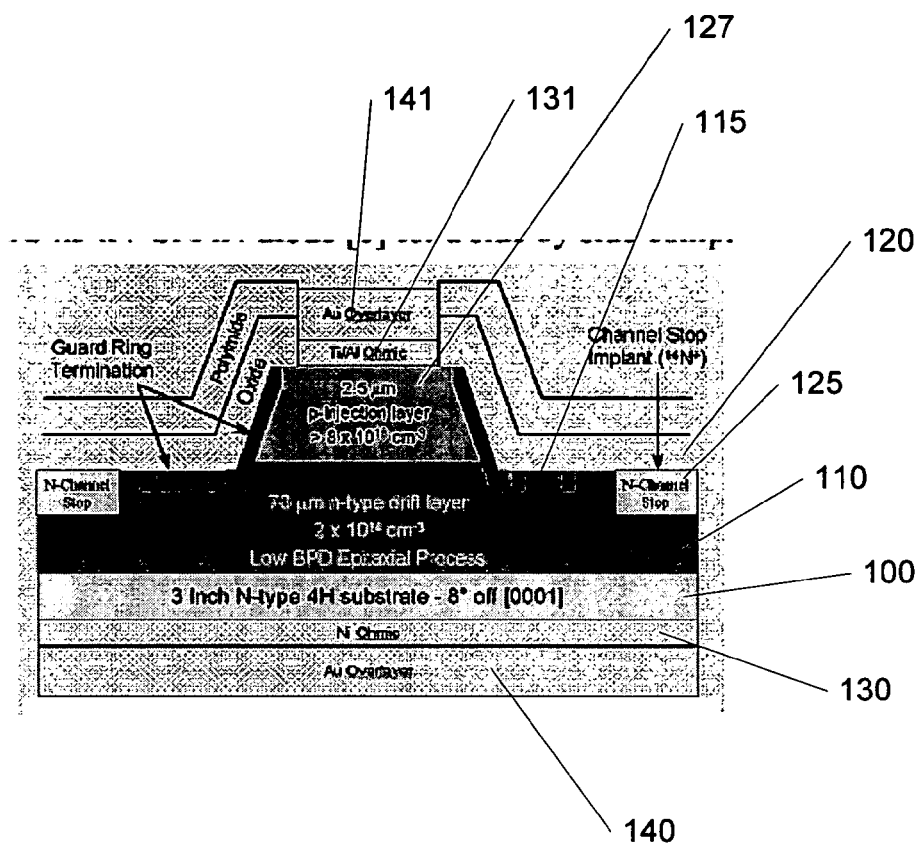
FIG. 1 is a cross-section illustrating PiN Diodes according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Silicon carbide power devices based on 4H polytype silicon carbide (4H—SiC) according to some embodiments of the present invention have the potential to revolutionize the power semiconductor industry. Benefiting from an order of magnitude larger critical electric field than silicon (Si) and sufficiently high carrier mobility, 4H—SiC power devices may be designed with thinner, heavier doped drift layers, which may enable high voltage capability with low conduction and switching losses. The advantages of SiC are discussed in a paper by Singh et al. (*IEEE Trans. Electron Dev.*, vol. 49, p. 2054, 2002) the disclosure of which is hereby incorporated herein by reference in its entirety. Furthermore, the wide bandgap may enable high temperature operation well beyond the limits of conventional packaging. PiN diodes have been shown to operate at elevated temperatures up to 800 K as discussed in HIGH-TEMPERATURE (UP TO 773K) OPERATION OF 6-KV 4H-SIC JUNCTION DIODES to Levinshtein, et al. (Solid-State Electronics; July 2005, Vol. 49 Issue 7, pages 1228-1232, the disclosure of which is hereby incorporated herein by reference as if set forth in its entirety. 4H—SiC Schottky diodes are supplanting Si in 300 V-1200 V applications. For even higher voltage applications, the rectifier of choice appears to be the 4H—SiC PiN diode, which has been demonstrated to block up to 20 kV with low $V_F$ of 6 V as discussed in LATEST ADVANCES IN 4H-SIC PIN AND MOS POWER DEVICES by Das (*Digest of International Semiconductor Device Research Symposium*, Washington, D.C., 2003, the disclosure of which is incorporated herein by reference as if set forth in its entirety.

However, as discussed above, technological issues like effective edge termination, low resistivity p-type ohmic contacts, and forward voltage stability have historically hampered PiN diode development. Thus, some embodiments of the present invention provide from 6 kV to about 10 kV, up to 50 A, 4H—SiC PiN diodes that may not experience the problems of existing SiC PiN diodes. In particular, high power 10 kV, up to 50 A, SiC PiN diodes having a low forward voltage drop ($V_F$) of 3.75 V and a fast reverse recovery time of 150 nsec are provided according to some embodiments of the present invention.

Furthermore, SiC PiN diodes according to some embodiments of the present invention may not experience the historical problems with the SiC PiN diode technology, such as ineffective edge termination ($V_{BD}$ increased to >70% of ideal breakdown voltage), poor ohmic contacts to p-type SiC ($\rho_c$ reduced to <$10^{-4}$ $\Omega$cm$^2$), and forward voltage drift ($\Delta V_F$ reduced to <0.1 V). Some embodiments of the present invention have addressed these issues with design, material, and process improvements which have resulted in high overall device yields according to some embodiments of the present invention as will be discussed further below with respect to FIGS. 1 through 18.

Exemplary devices according to some embodiments of the present invention are schematically illustrated in FIG. 1. However, embodiments of the present invention should not be construed as limited to the particular exemplary embodiments described herein but may include any suitable structure that provides PiN Diode characteristics as described herein.

Referring first to FIG. 1, a cross section of PiN diodes, for example, a 10 kV, 4H—SiC PiN diode, according to some embodiments of the present invention will be discussed. As illustrated in FIG. 1, a substrate 100 is provided on which PiN Diodes according to some embodiments of the present invention may be formed. In particular embodiments of the present invention, the substrate 100 may be a conducting n-type silicon carbide (SiC) substrate that may be, for example, 4H polytype of silicon carbide. The substrate 100 may have a resistivity of from about 0.017 to about 0.022. An n-type drift layer 110 is provided on the substrate 100. The n-type drift layer may have a thickness of about 100 μm and a carrier concentration of about $2\times10^{14}$ cm$^3$. A p-type anode injection layer 127 is provided on the drift layer 110. The p-type anode injection layer 127 may have a thickness of about 2.5 μm and a carrier concentration of about $8\times10^{18}$ cm$^3$. The p-type anode injection layer 127 may be doped with aluminum (Al). The p-type anode injection layer 127 may have first and second portions. A first portion may be a p$^+$ layer having a carrier concentration of about $8\times10^{18}$ cm$^3$. A second layer may be provided on the first layer. The second layer may be a p$^{++}$ layer having a carrier concentration of $5\times10^{20}$ cm$^3$.

The n-type drift layer 110 and the p-type anode injection layer 127 may be epitaxial layers that are continuously grown on the substrate, for example, a 0.6 cm$^{-2}$ micropipe density 8° off-axis (0001) 4HN 3 inch substrate 100. The epitaxial layers may be fabricated using, for example, the process described in United States Patent Publication No. US 2005/0064723 to Sumakeris, the disclosure of which is hereby incorporated by reference as if set forth in its entirety. Other low BPD epitaxial processes discussed in, for example, a paper by Sumakeris et al. (*Mater. Sci. Forum,* 457-460, 1113 (2004)) and Sumakeris et al. (*ICSCRM* 2005, Pittsburgh, Pa. (2005)) the disclosures of which are hereby incorporated herein by reference in their entirety.

The device is mesa isolated by etching down to the n$^-$ drift layer 110 in the field areas using, for example, a reactive ion etch (RIE). Mesa areas for each diode design were based on a designed current density of 100 A/cm$^2$ for 2 A, 5 A, and 50 A diodes, or 142 A/cm2 for 25 A diodes, with mesas measuring 1.46 mm×1.46 mm (2 A), 1.46 mm×3.51 mm (5 A), 4.21 mm×4.21 mm (25 A), and 7.08 mm×7.08 mm (50 A).

It will be understood that the mesa sizes discussed herein are provided for exemplary purposes and embodiments of the present invention are not limited to this configuration. For example, the mesa sizes discussed above may only correspond to 6 kV diodes according to some embodiments of the present invention. It will be further understood that mesa sizes may vary slightly for different blocking thicknesses. Thus, for example, a mesa for a 50 A/10 kV diode may have slightly different dimensions than a mesa for a 50 A/6 kV diode.

An aluminium (Al) implanted guard ring-based termination 115 is provided/formed around the device periphery while a nitrogen (N) implanted channel stop regions 125 ground the field area away from the devices. The implants are activated with a 1600-1650° C. Argon (Ar) anneal in the presence of silicon (Si) overpressure.

In some embodiments of the present invention, a junction termination extension (JTE) technique may be used as discussed in *Multiple-Zone Single-Mask Junction Termination Extension: A High-Yield Near-Ideal Breakdown Voltage Technology* by Trantraporn et al. (*IEEE TRATISACTIONS ON ELECTRON DEVICES*, Vol. ED-34, No. 10, OCTOBER 1987), the disclosure of which is incorporated herein by reference as if set forth in its entirety.

A passivation layer 120 is provided on the surface of the device. The passivation layer 120 may be formed using a two step passivation process. A first portion of the passivation layer 120 is thermally grown to a thickness of from about 600 Å to about 700 Å. A second portion of the passivation layer 120 may be provided on the first portion. The second portion may be deposited on the first portion using, for example, a chemical vapor deposition (CVD) process at a temperature of about 410° C. The second portion may have a thickness of about 1 μm. The passivation layer 120 may include silicon dioxide ($SiO_2$) and/or polymide. An ohmic contact 131 including, for example, titanium/aluminium (Ti—Al) is provided on the anode injection layer 127. An ohmic contact 130 including, for example, nickel (Ni) is provided on the cathode. The contacts were annealed at 1000° C. in Ar. As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents. Gold (Au) overlayers 140 and 141 are provided on the ohmic contacts 130 and 131, respectively, to aid in current spreading and/or die attach. In other words, sintered Ti—Al and Ni contacts 130 and 131 are made to the anode and cathode, respectively, before depositing thick Au overlayers 140 and 141.

Figure 2:
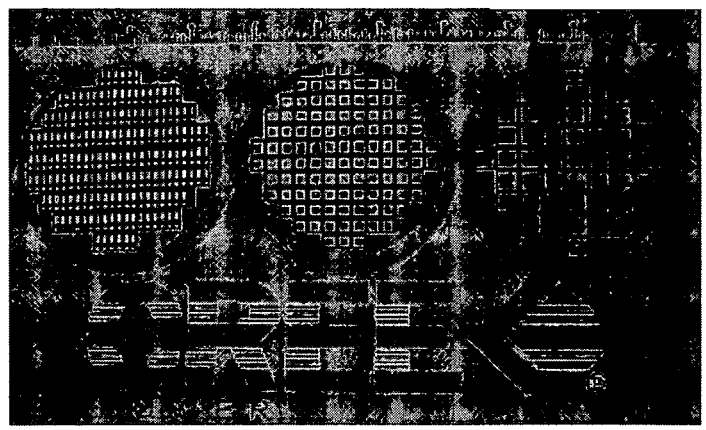
FIG. 2 is a picture illustrating a 3" 4H—SiC wafers with 2 A and 5 A diodes, 25 A diodes and 50 A diodes from left to right according to some embodiments of the present invention.

PiN Diodes according to some embodiments of the present invention, for example, 50 A PiN diodes, may be provided on 8.7 mm×8.7 mm chips, which have a 0.50 $cm^2$ active area. In some embodiments of the present invention, a total of 48 chips can be fabricated on a single 3 inch wafer as illustrated, for example, in FIG. 2. In particular, FIG. 2 illustrates completed wafers with, from left to right, 2 A and 5 A diodes (combined on one wafer), 25 A diodes, and 50 A diodes.

Figure 3:
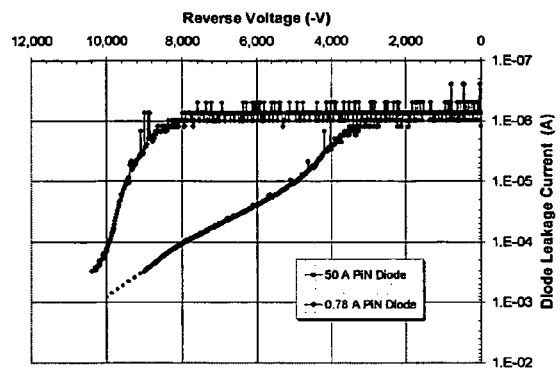
FIG. 3 is a graph illustrating reverse voltage (−V) vs. diode leakage current (A) of a 50 A diode (8.7 mm×8.7 mm) and a 0.78 A diode according to some embodiments of the present invention.

Referring now to FIG. 3, a graph illustrating Reverse Voltage (−V) vs. Diode Leakage Current (A) of a 50 A diode (8.7 mm×8.7 mm) and a 0.78 A diode according to some embodiments of the present invention will be discussed. FIG. 3 illustrates the reverse blocking capability of a typical PiN diode. Reverse blocking is measured out to 9 kV where the leakage current exceeds the current compliance limit of the measurement apparatus. Extrapolating the leakage current to 10 kV a low leakage current density of approximately 1 $mA/cm^2$ (based on a device footprint of 0.615 $cm^2$) is estimated. The validity of this extrapolation is contingent on the absence of avalanching prior to 10 kV. Reverse operation of small 0.78 A diodes confirm full 10 kV blocking capability without any premature avalanche as illustrated in FIG. 3. Hence, a 10 kV blocking capability is implied for the large devices blocking, such as greater than 7 kV. As illustrated in FIG. 3, the large diode demonstrates greater than 9 kV blocking that is current compliance limited. The dashed line extrapolates the reverse blocking to 10 kV with only 1 $mA/cm^2$. The small diode confirms 10 kV capability.

Figure 4:
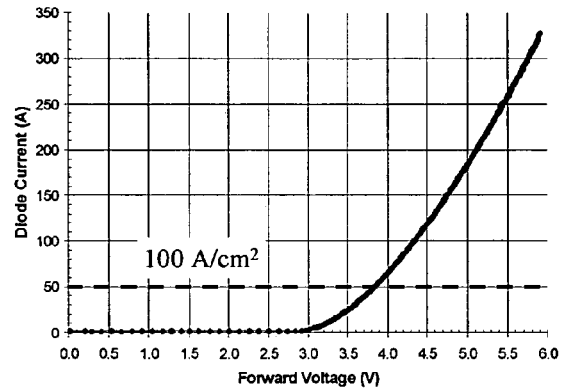
FIG. 4 is a graph illustrating forward diode current (A) vs. forward voltage (V) of a large 10 kV diode with a 3.75 forward drop at 50 A and 5.9 V forward drop at 328 A according to some embodiments of the present invention.
Figure 5:
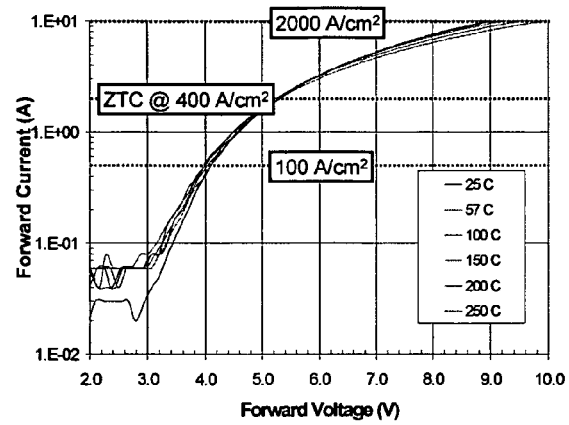
FIG. 5 is a graph illustrating forward current (A) vs. forward voltage (V) measured at several temperatures according to some embodiments of the present invention.

Referring now to FIG. 4, pulsed forward I-V characteristic of a large 10 kV diode with a 3.75 V forward drop at 50 A and 5.9 V forward drop at 328 A indicating a high level of conductivity modulation. As illustrated in FIG. 4, a low forward voltage drop of 3.75 V is observed at 50 A (100 $A/cm^2$) indicating a high degree of conductivity modulation. 4H—SiC PiN diodes are capable of handling very high current densities and we have measured this large device out to a pulsed current of 328 A (656 $A/cm^2$) at a low forward drop of 5.9 V. For a single chip, this demonstrates over 3 MW of pulsed power. As illustrated in FIG. 5, these devices also show excellent forward characteristics with respect to temperature.

Referring now to FIG. 5, forward I-V curve measured at several temperatures on a small 10 kV device where a positive temperature coefficient at high current density facilitates device paralleling. The differential resistance at low current density remains constant versus temperature because the increase in carrier lifetime is balanced by the reduction in carrier mobility and diffusivity. The $V_F$ at low current densities decreases slightly with temperature due to bandgap narrowing effects that reduce the built-in potential. This introduces a concern for thermal runaway. However, at high current densities, the behavior reverses to a positive temperature coefficient, thereby making these devices attractive for use in a parallel configuration.

Figure 6:
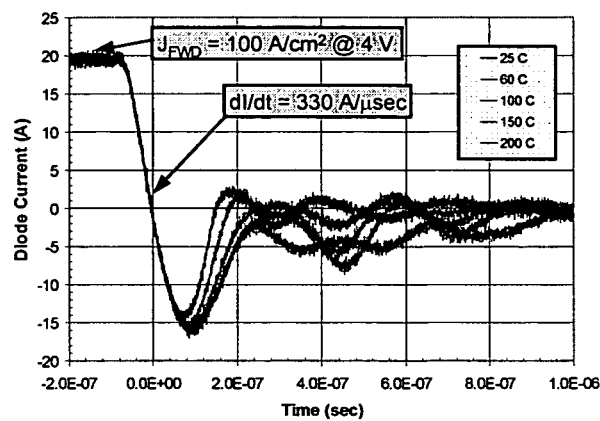
FIG. 6 is a graph illustrating a dI/dt reverse recovery transient showing fast turn-off with very little reverse recovery charge for a 10 kV, 20 A device, even at elevated temperatures according to some embodiments of the present invention.

Referring now to FIG. 6, a graph illustrating a dI/dt reverse recovery transient showing fast turn-off with very little reverse recovery charge for a 10 kV, 20 A device, even at elevated temperatures according to some embodiments of the present invention will be discussed. Large dI/dt reverse recovery transient showed fast turn-off with very little reverse recovery charge for a 10 kV, 20 A device, even at elevated temperatures. One potential drawback of a well modulated PiN diode is that the switching ability may suffer, especially the turn-off transient, due to the extra time needed for carrier removal in the drift layer. As illustrated in FIG. 6, the reverse recovery of the 10 kV diodes shows a fast 150 nsec recovery at room temperature with very little reverse recovery charge despite an aggressive dI/dt of 330 A/μsec.

At elevated temperatures, the high speed switching capability remains intact with very minimal charge increase and a 300 nsec recovery time.

To be a commercially viable product, stable device performance should be demonstrated across the entire wafer. Historically, the 4H—SiC PiN diodes have suffered from forward voltage instability, where the $V_F$ may increase by several volts during forward operation as discussed in H. Lendenmann et al. (*Mater. Sci. Forum*, Vol. 389-393 p. 1259, 2002), the disclosure of which is incorporated herein by reference as if set forth in its entirety. As discussed in Sumakeris, et al. (*Mater. Sci. Forum*, vol. 457-460, p. 1113, 2004), under forward bias, bipolar current flow in the "i" layer causes electron-hole recombination; the recombination provides energy to the lattice allowing basal plane screw dislocations (BPD) to generate stacking faults; the stacking fault becomes negatively charged by trapping electrons; electron injection is attenuated at the cathode with a corresponding reduction of hole injection at the anode; the area under the fault becomes devoid of plasma thereby reducing the effective current handling area of the device; and a larger amount of forward bias is now needed to maintain the same forward current level.

Figure 7:
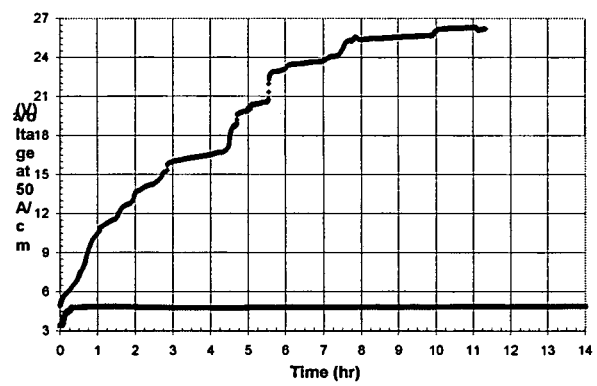
FIG. 7 is a graph illustrating voltage at 50 A/cm$^2$ (V) vs. Time (hr) showing that a novel epitaxy may produce more stable 4H—SiC PiN diodes (forward voltage stability) according to some embodiments of the present invention.

Hence, the key to producing drift-free PiN structures is the reduction of BPDs. Typically, the areal density of BPDs in the substrate is ~2000 cm$^{-2}$ of which 90% can be turned into relatively benign threading edge dislocations in epitaxy. Recent innovations have reduced the epilayer BPD density below 10 cm$^{-2}$ as discussed in Sumakeris, et al. (*Mater. Sci. Forum*, vol. 457-460, p. 1113, 2004) such that the devices have become fairly well behaved as illustrated in FIG. 7. Devices can now be effectively screened for their $V_F$ stability by a simple on-wafer 30 min constant current stress at 50 A/cm$^2$ as discussed in B. A. Hull et al. (*J Electron. Mater.*, vol. 34, no. 4, 2005), the disclosure of which is hereby incorporated herein by reference as if set forth in its entirety.

Referring now to FIGS. 8A and 8B, graphs of number of devices vs. forward voltage drift (mV) for two different types of epitaxy according to some embodiments of the present invention will be discussed. The histograms of FIGS. 8A and 8B illustrate the number of stable devices by binning the devices according to the amount of forward voltage increase after the forward stress. Using 100 mV as an acceptable amount of $V_F$ drift, we observe that the drift yield increased from 17% to 67% by incorporating the novel epitaxy while not compromising the reverse blocking yield as illustrated in FIGS. 9A and 9B. FIGS. 9A and 9B are reverse blocking wafermaps for different types of epitaxy according to some embodiments of the present invention.

TABLE 1

| Epitaxy | BPD (cm$^{-2}$) | Device | Drift Yield | 10 kV Yield | Total Yield |
|---|---|---|---|---|---|
| Original Process | 180 | 50 A | 17% | 37% | 6% |
| New Process | 20 | 50 A | 67% | 35% | 23% |

Table 1 illustrates progress toward making the large hero devices more prevalent across the wafer. Overall device yield is a respectable 23% for 10 kV 50 A PiN diodes having improved by nearly 4× over the previous technology.

Thus, as discussed herein, according to some embodiments of the present invention, state-of-the-art 10 kV, 50 A 4H—SiC diodes have been fabricated with low $V_F$ of 3.75 V, fast switching, and stable operation with respect to temperature.

TABLE 2

| Characteristic | Symbol | Units | Cree SiC | Pwrex Si | VMI UF Si |
|---|---|---|---|---|---|
| 25° C. Peak Reverse Blocking | $V_{RRM}$ | kV | 10 | 9.0 | 10 |
| 25° C. Reverse Leakage Current at $V_{RRM}$ | $I_{RRM}$ | mA | 0.5 | 1.0 | 0.1 |
| 25° C. Average Forward Current | $I_{F(av)}$ | Amps | 50 | 60 | 50 |
| 25° C. Forward Voltage at $I_{F(av)}$ | $V_F$ | Volts | 3.8 | 12.4 | 14.0 |
| 25° C. Reverse Recovery Time | $t_{rr}$ | nsec | 150 | 230 | 100 |
| 25° C. Reverse Recovery Charge | $Q_{rr}$ | μC | 1.1 | 11 | 5 |
| 150° C. Reverse Recovery Time | HT $t_{rr}$ | nsec | 300 | — | 500 |
| 150° C. Reverse Recovery Charge | HT $Q_{rr}$ | μC | 1.6 | — | 24.75 |

Table 2 illustrates how the 4H—SiC PiN diodes compare with similarly rated Si rectifier stacks. In addition to the simplicity of a single chip, the 4H—SiC PiN diode offers a lower forward voltage drop, reduced reverse recovery charge, and excellent high temperature characteristics where the switching is well behaved and the on-current does not require additional derating. With the advent of >20% overall device yield, a significant step has been made in the evolution of a commercially viable SiC PiN diode technology expected to meet the demands of high voltage, high frequency power conversion applications.

In some embodiments of the present invention the epitaxial layers may be formed as discussed in EVOLUTION OF DRIFT-FREE, HIGH POWER 4H-SIC PIN DIODES to Das et al. (*ICSCRM* 2005, Pittsburgh, Pa., 2005), the disclosure of which is hereby incorporated herein by reference as if set forth in its entirety.

Results according to further embodiments of the present invention will now be discussed with respect to FIGS. 10 through 12. Table 3 summarizes the wafer-level yield statistics for the best yielding wafers of various current rated PiN diodes that are designed to block 6 kV according to some embodiments of the present invention. As illustrated in Table 3, the best total wafer yield of 69 percent was achieved on 2 A diodes. Nevertheless, even on a 50 A diode wafer, with a die size of 8.64 mm×8.56 mm, a total yield of 62 percent was achieved. The best total yield achieved on a 25 A wafer was somewhat lower, at 43 percent, but the 25 A diode wafers were fabricated with previous generation epitaxial growth and device fabrication processes. The latest results from the 2 A/5 A and 50 A diode designs, wafer-level device yields that indicate the commercial viability of the 4H—SiC PiN diode technology have been achieved.

TABLE 3

| Diode Rating | Chip dimensions [mm] | $V_F$ Yield [$V_F \leq 4.0$ V] | 6 kV Blocking Yield [$I_R \leq 1$ mA/cm$^2$] | $V_F$ Drift Yield [$\Delta V_F \leq 0.1$ V] | Total Yield |
|---|---|---|---|---|---|
| 2 A | 2.79 × 2.79 | 100% | 70.6% | 98.3% | 69.4% |
| 5 A | 2.79 × 4.84 | 100% | 71.4% | 95.7% | 64.7% |
| *25 A | 5.36 × 5.36 | 100% | 49.0% | 87.1% | 42.7% |
| 50 A | 8.64 × 8.56 | 100% | 64.4% | 96.6% | 62.2% |

*25 Amp diode wafer was from an earlier generation process

Figure 10:
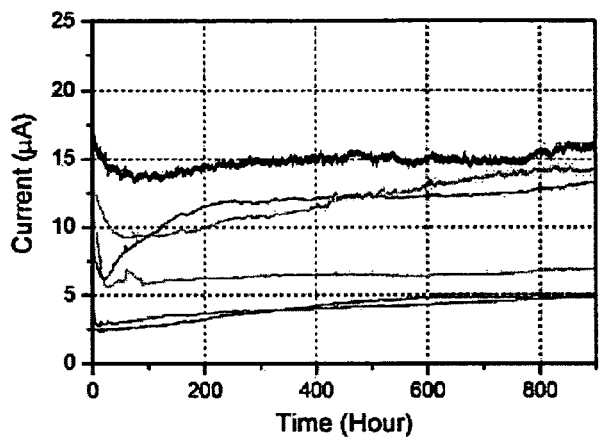
FIG. 10 is a graph of time (hours) vs. current (μA) illustrating room temperature time dependent reverse leakage current at 5 kV reverse bias of six packaged 6 kV/25 A 4H—SiC PiN diodes according to some embodiments of the present invention.

Referring now to FIG. 10, time dependent leakage current of six packaged 6 kV/25 A 4H—SiC PiN diodes under long term reverse bias at 5 kV will be discussed. As illustrated therein, during 900 hours at 5 kV reverse bias, the maximum increase in leakage current for any diode was 6 μA. However, some arcing between package leads was observed during testing (especially with increases in humidity) and no effort to separate diode leakage currents from package leakage currents were made. Thus, reverse leakage current increases could not be attributed to the diodes themselves. No change in the forward I-V characteristics were observed following long-term reverse biasing.

Figure 11:
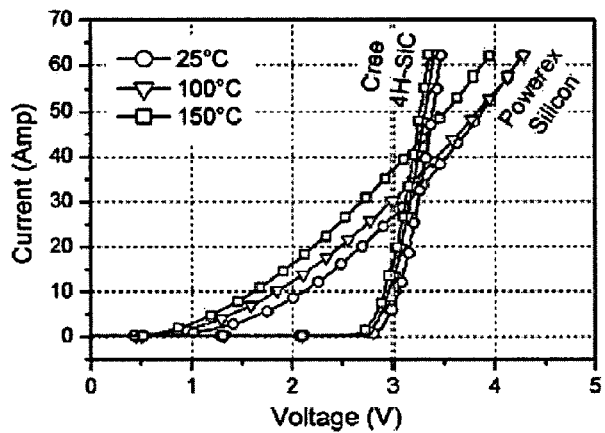
FIG. 11 is a graph of voltage (V) vs. current (A) temperature dependent forward I-V characteristics of Cree 4H—SiC 6 kV/50 A PiN diode (black) and Powerex 4.5 kV/60 A Si PiN diode (grey) according to some embodiments of the present invention.

Referring now to FIG. 11, the temperature dependent forward current-voltage (I-V) characteristics of a 50 A 4H—SiC PiN diode along with those of a 4.5 kV/60 A Si PiN diode will be discussed. The 4H—SiC PiN diode was taken to 60 A (120 A/cm$^2$) to provide a suitable comparison to the Si PiN diode. At 60 A, the $V_F$ Of the SiC diode was 0.75 V lower than the Si diode at room temperature, corresponding to a 45 W decrease in DC forward dissipated power, or a reduction of 18 percent. At 150° C., the 4H—SiC PiN diode reduced the power dissipation by 32 W at 60 A, or 14 percent, from that of the Si PiN diode.

Figure 12:
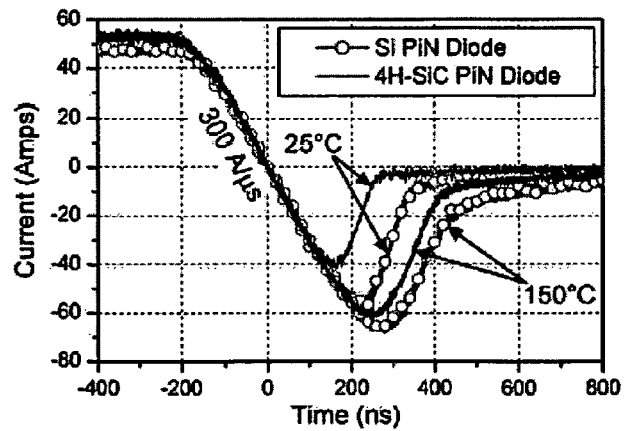
FIG. 12 is a graph of time (ns) vs. current (A) illustrating temperature dependent reverse recovery characteristics of Cree 4H—SiC 6 kV/50 A PiN diode and Powerex 4.5 kV/60 A Si PiN diode (circles) according to some embodiments of the present invention.

Referring now to FIG. 12, a comparison of the reverse recovery transients at 25° C. and 150° C. of the 4H—SiC PiN diode and the Si PiN diode will be discussed. Furthermore, peak reverse recovery current ($I_{RM}$), reverse recovery time ($t_{rr}$), stored charge ($Q_{rr}$), and stored energy ($E_{rr}$) are presented in Table 4 for all conditions tested.

TABLE 4

| | Peak Reverse Current, $I_{RM}$ [Amps] | | Reverse Recovery Time, $t_{rr}$ [nsec] | | Stored Charge, $Q_{rr}$ [μC] | | Stored Energy, $E_{rr}$ [mJ] | |
|---|---|---|---|---|---|---|---|---|
| | 4H—SiC | Si | 4H—SiC | Si | 4H—SiC | Si | 4H—SiC | Si |
| 25° C. | 39.8 | 54.8 | 270 | 360 | 6.3 | 11.7 | 1.8 | 3.2 |
| 50° C. | 43.3 | 56.6 | 300 | 375 | 7.7 | 12.7 | 2.2 | 3.5 |
| 100° C. | 52.1 | 60.1 | 360 | 430 | 11.2 | 15.8 | 3.1 | 4.4 |
| 150° C. | 61.5 | 66.3 | 440 | 490 | 15.7 | 19.1 | 4.3 | 5.4 |

The diodes were switched from a nominal 50 A DC forward current to −500 V reverse bias at a 300 A/μs switching transient. At all temperatures the 4H—SiC PiN diode showed significantly lower $I_{RM}$, $t_{rr}$, $Q_{rr}$, and Err than the Si PiN diode. Based on measured Err, switching loss power savings for the 4H—SiC PiN diode range from 20 percent at 150° C. to 44 percent at 25° C. Due to the need for separating the diode (at temperature) from the test switch (at room temperature), parasitic inductance and resistance in the circuit wires may be artificially skewing the reverse recovery characteristics to longer recovery times and higher energies. However, no alterations to the test circuit were made between testing the 4H—SiC diode and the Si diode, thus providing an accurate comparison. Reverse recovery switching bias was limited to a 500 V reverse bias by limitations in test equipment.

Results according to further embodiments of the present invention will now be discussed with respect to FIGS. 13 through 16. A 4H—SiC PiN diode that blocks up to about 4.5 kV and conducts up to about 180 A (at 100 A/cm2) under a low forward voltage ($V_F$) of 3.5 V is provided. This single-chip 4H—SiC PiN diode, at 1.5 cm×1.5 cm, is the largest discrete 4H—SiC power device ever reported, with over 2 times the area of the previous largest chip, a 1 cm×1 cm, 100 A 4H—SiC thyristor as discussed in Agarwal et al. (ICSCRM 2005, Pittsburgh, Pa., (September 2005)), the disclosure of which is incorporated herein by reference as if set forth in its entirety. The diode exhibited a leakage current of less than about 5.0 μA at 4.5 kV, or less than 2.8 μA/cm$^2$, giving a rated forward current to reverse leakage current ratio of greater than about 3×107. Successful fabrication of such a large discrete 4H—SiC PiN diode with such exceptional breakdown characteristics is a testament to the advances in SiC materials and device fabrication technologies.

Figure 13:
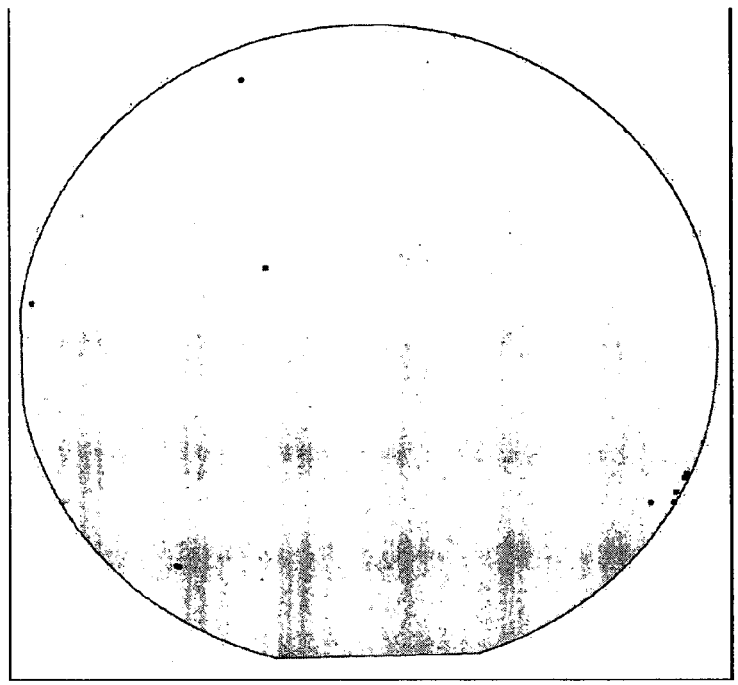
FIG. 13 is a micropipe distribution map for wafers on which 180 A/4.5 kV 4H—SiC PiN diodes were fabricated according to some embodiments of the present invention.

The 180 A/4.5 kV 4H—SiC PiN diodes were fabricated on 3 inch 4H—SiC wafers cut 8° off of the [0001] basal plane. A exemplary micropipe map of the wafers is illustrated in FIG. 13. The wafers had an overall micropipe density of 0.2 micropipes/cm$^2$, with a total of 10 micropipes on wafer, which to date is one of the best micropipe densities achieved in any 3 inch 4H—SiC boule ever grown at Cree as discussed in Powell (Industrial News Session, ICSCRM 2005, Pittsburgh, Pa., (September 2005)), the disclosure of which is incorporated herein by reference as if set forth in its entirety. Furthermore, all but one of the micropipes were located near the wafer periphery for an effective micropipe density of 0.03/cm$^2$ over the central 70% of the wafer area. A N-doped 50 μm thick epitaxial layer doped 2.0×10$^{14}$ cm$^{-3}$ and an Al doped 2.5 μm thick epitaxial layer doped at 8.0×10$^{18}$ cm$^{-3}$ were grown continuously in one epitaxial run. An epitaxial process that reduces the density of screw-type basal plane dislocations (BPD) in the epitaxial film to suppress the irreversible increase in $V_F$ ($V_F$ drift) typically seen in 4H—SiC PiN diodes was used. Such an epitaxial process is discussed in, for example, Sumakeris, et al. (Mater. Sci. Forum, vol. 457-460, p. 1113, 2004), the disclosure of which is incorporated herein by reference as if set forth in its entirety. Diode mesas measuring 13.58 mm per side (180 A diodes) or 10.01 mm per side (100 A diodes) were isolated with a reactive ion etch.

A p-type multi-zone junction termination extension (JTE) was then ion implanted around the mesa peripheries, followed by an n-type channel stop around the chip peripheries. Following implant activation at 1650° C., the diodes were passivated with a 1.0 μm SiO$_2$ layer, and ohmic contacts were deposited on the anode and cathode and were annealed at 1000° C. in Argon. Finally thick Au layers were deposited on the anode and cathode contacts for current spreading and die-attach.

Figure 14:
FIG. 14 is a photograph illustrating a completed 4.5 kV 4H—SiC PiN diode wafer, with 180 Amp, 100 Amp, 13 Amp, and 0.2 Amp diodes according to some embodiments of the present invention.
Figure 15:
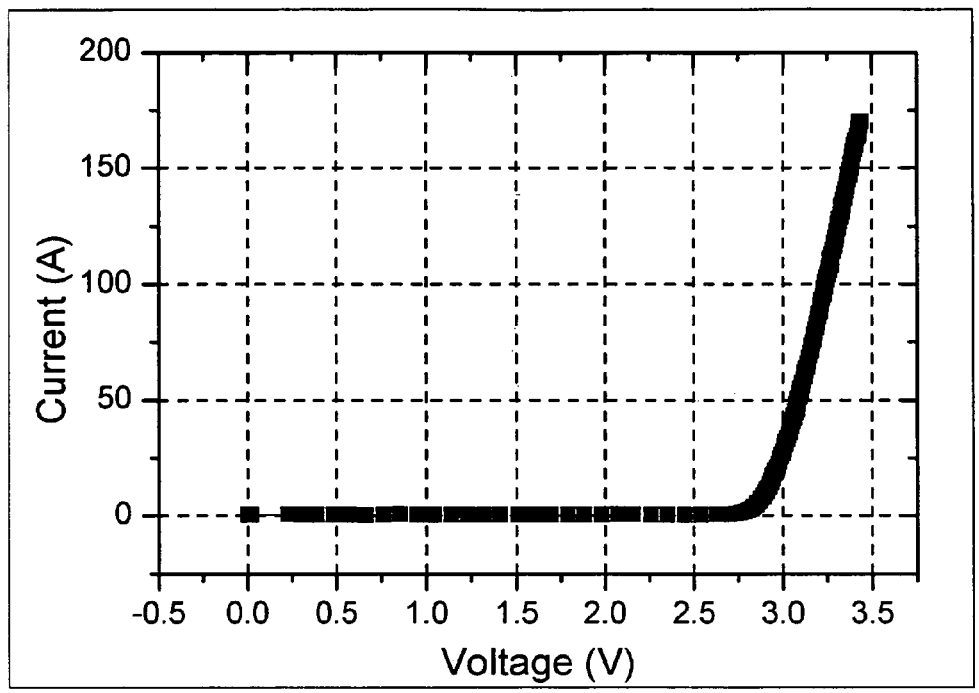
FIG. 15 is a graph illustrating forward characteristics of 180 Amp/4.5 kV 4H—SiC PiN diode according to some embodiments of the present invention.
Figure 16:
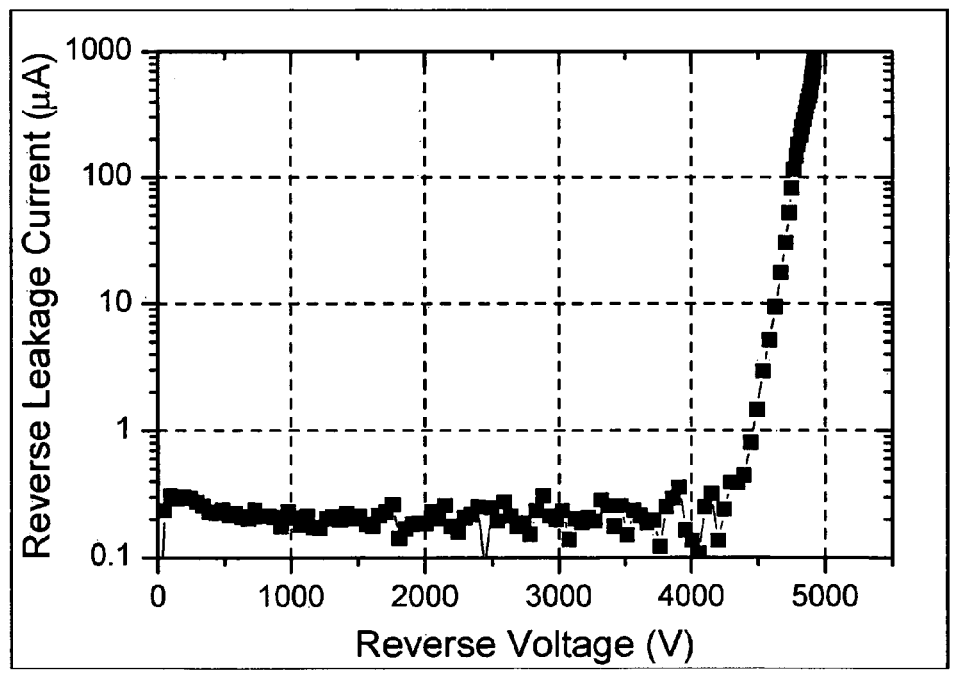
FIG. 16 is a graph illustrating reverse current-voltage characteristics of 180 Amp/4.5 kV 4H—SiC PiN diode according to some embodiments of the present invention.

A photograph of a completed wafer is illustrated in FIG. 13. Furthermore, FIGS. 14 and 15 illustrate on-wafer diode forward and the optimum reverse I-V characteristics of a 180 A diode. The V$_F$ at 180 A was 3.5 V, and the reverse leakage current at 4.5 kV was 2.0 μA, or 1.1 μA/cm2. There was a sharp increase in the reverse leakage current near 4.5 kV, showing well behaved avalanche breakdown characteristics. On the best wafer (of two), five of the six 180 A diodes reached the blocking specification of less than 900 μA (0.5 mA/cm2) at 4.5 kV, and the overall lot yield was 8 diodes of 12. This phenomenal single wafer device yield of 83% (or 67% total lot yield) demonstrates that extremely high power, discrete SiC devices are commercially feasible with current state of the art 4H—SiC substrates, epitaxy, and device processing.

Figure 17:
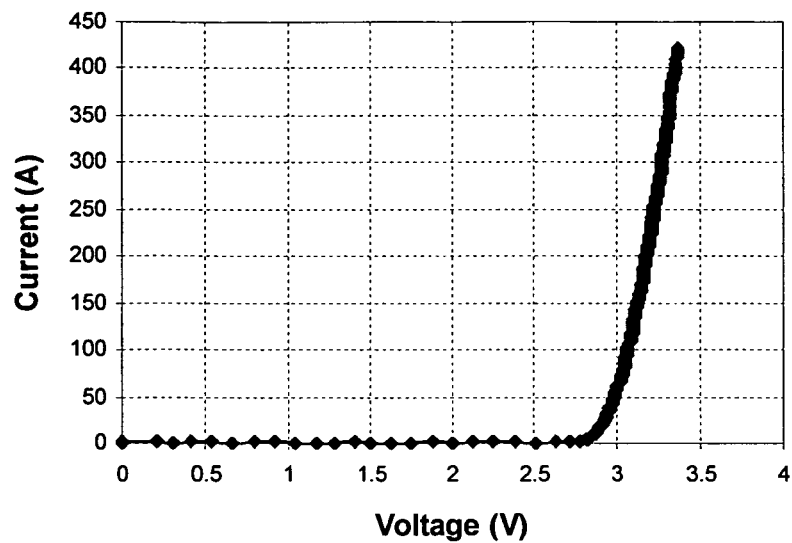
FIG. 17 is a graph illustrating pulsed forward current characteristics of a packaged 180 A (at 100 A/cm$^2$), 4.5 kV 4H—SiC PiN diode at 25° C. according to some embodiments of the present invention.
Figure 18:
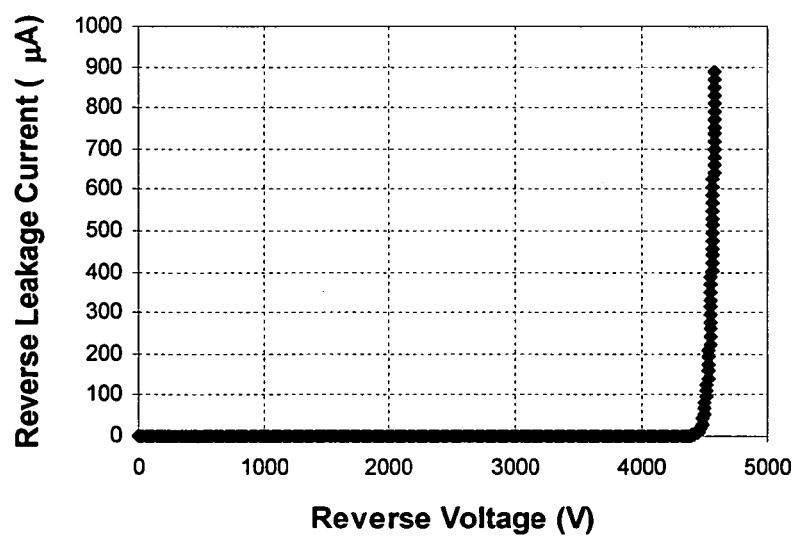
FIG. 18 is a graph illustrating reverse I-V characteristics of packaged 180 A, 4.5 kV 4H—SiC PiN diode at 25° C. according to some embodiments of the present invention.

Results according to further embodiments of the present invention will now be discussed with respect to FIGS. 17 through 18. FIG. 17 is a graph illustrating pulsed forward current characteristics of a packaged 180 A (at 100 A/cm$^2$), 4.5 kV 4H—SiC PiN diode at 25° C. and a maximum pulsed current of 420 Amps at 3.36 Volts forward bias. Furthermore, FIG. 18 is a graph illustrating Reverse I-V characteristics of a packaged 180 A, 4.5 kV 4H—SiC PiN diode at 25° C.

In the drawings and specification, there have been disclosed typical embodiments of the invention, and, although specific terms have been employed, they have been used in a generic and descriptive sense only and not for purposes of limitation.

That which is claimed is:

1. A Silicon Carbide (SiC) PiN Diode having a reverse blocking voltage (VR) from about 3.0 kV to about 10.0 kV and a forward voltage (VF) of less than about 4.3 V, wherein the VF is substantially stable during operation of the PiN Diode and wherein the SiC PiN Diode has an average forward current (IF) of less than about 420 A when operated at a temperature of between 25° C. and 530° C.,
   wherein the SiC PiN Diode is a 10 kV, 4H—SiC PiN diode, the SiC PiN Diode further comprising:
   a conducting n-type SiC substrate;
   an n-type SiC drift layer on the substrate;
   a p-type SiC anode injection layer on the n-type drift layer, the p-type SiC Anode injection layer having first and second portions,
   wherein the first portion on the drift layer is a p+ layer having a first carrier concentration;
   wherein the second portion is a p++ layer having a second carrier concentration greater than the first carrier concentration; and
   wherein the diode has a blocking voltage (VR) of about 10.0 kV, an average IF of about 50 A, a reverse recovery time (trr) of about 300 nsec and a reverse recovery charge (Qrr) of about 1.6 μC when operating at a temperature of about 150° C.

2. The SiC PiN Diode of claim 1 having an average forward current (IF) of not greater than about 200 A.

3. The SiC PiN Diode of claim 1 having a forward current of about 2 A:
   wherein a plurality of SiC PiN diodes are provided on a single chip, the chip being about 2.8 mm by 2.8 mm;
   wherein the plurality of SiC PiN diodes have a VF of less than about 4.0 V, no less than about seventy percent of the plurality of SiC PiN diodes have a blocking voltage of about 6 kV and a reverse leakage current (IR) of not greater than 1.0 mA/cm2 and almost all of the plurality of SiC PiN diodes have a forward voltage drift of no greater than 0.1V.

4. The SiC PiN Diode of claim 3, wherein the chip has a total yield of no less than about seventy percent.

5. The SiC PiN Diode of claim 1 having a forward current of about 5 A:
   wherein a plurality of SiC PiN diodes are provided on a single chip, the chip being about 2.8 mm by about 4.85 mm;
   wherein the plurality of SiC PiN diodes have a VF of less than about 4.0 V, no less than about seventy one percent of the plurality of SiC PiN diodes have a blocking voltage of about 6 kV and a reverse leakage current (IR) of not greater than 1.0 mA/cm2 and no less than about ninety six percent of the plurality of SiC PiN diodes have a forward voltage drift of no greater than 0.1 V.

6. The SiC PiN Diode of claim 5, wherein the chip has a total yield of no less than about sixty five percent.

7. The SiC PiN Diode of claim 1 having a forward current of about 25 A:
   wherein a plurality of SiC PiN diodes are provided on a single chip, the chip being about 5.4 mm by about 5.4 mm;
   wherein the plurality of SiC PiN diodes have a VF of less than about 4.0 V, no less than about fifty percent of the plurality of SiC PiN diodes have a blocking voltage of about 6 kV and a reverse leakage current (IR) of not greater than 1.0 mA/cm2 and no less than about eighty seven percent of the plurality of SiC PiN diodes have a forward voltage drift of no greater than 0.1V.

8. The SiC PiN Diode of claim 7, wherein the chip has a total yield of no less than about forty three percent.

9. The SiC PiN Diode of claim 1 having a forward current of about 5 A:
   wherein a plurality of SiC PiN diodes are provided on a single chip, the chip being about 8.65 mm by about 8.55 mm;
   wherein the plurality of SiC PiN diodes have a VF of less than about 4.0 V, no less than about sixty five percent of the plurality of SiC PiN diodes have a blocking voltage of about 6 kV and a reverse leakage current (IR) of not greater than 1.0 mA/cm2 and no less than about ninety six percent of the plurality of SiC PiN diodes have a forward voltage drift of no greater than 0.1V.

10. The SiC PiN Diode of claim 9, wherein the chip has a total yield of no less than about sixty three percent.

11. The SiC PiN Diode of claim 1, wherein the SiC PiN Diode comprises a 4H SiC PiN Diode.

12. The SiC PiN Diode of claim 1, wherein a substantially stable VF during operation of the PiN Diode comprises a VF drift of about 0.1 V or less.

13. The SiC PiN Diode of claim 1, wherein a substantially stable VF during operation of the PiN Diode comprises a VF that is approximately the same from time zero to at least about 200 hours.

14. The SiC PiN Diode of claim 1, further comprising:
    an aluminum implanted guard ring on the injection layer; and a passivation layer on the injection layer and the guard ring.

15. The SiC PiN Diode of claim 14, wherein the passivation layer comprises first and second portions, the first portion of the passivation layer being thermally grown and having a thickness of from about 600 Å to about 700 Å and the second portion of the passivation layer on the first portion and being deposited on the first portion and having a thickness of about 1 μm.

16. The SiC Pin Diode of claim 15, wherein the passivation layer comprises silicon dioxide (SiO2) and/or polymide.

17. The SiC Pin Diode of claim 1, wherein the first portion on the drift layer is a p+ layer having a carrier concentration of about $8 \times 10^{18}$ cm$^3$; and
wherein the second portion is a p++ layer having a carrier concentration of about $5 \times 10^{20}$ cm3.

18. A 4H Silicon Carbide (SiC) PiN Diode having a reverse blocking voltage (VR) from about 3.0 kV to about 10.0 kV and a forward voltage (VF) of less than about 4.3 V, an average forward current of not greater than about 420 A when operated at a temperature of between 25° C. and 530° C.,
wherein the SiC PiN Diode is a 10 kV, 4H—SiC PiN diode, the SiC PiN Diode further comprising:
a conducting n-type SiC substrate;
an n-type SiC drift layer on the substrate;
a p-type SiC Anode injection layer on the n-type drift layer, the p-type SiC Anode injection layer having first and second portions,
wherein the first portion on the drift layer is a p+ layer having a carrier concentration of about 8×1018 cm3;
wherein the second portion is a p++ layer having a carrier concentration of about 5×1020 cm3; and
wherein the diode has a blocking voltage (VR) of about 10.0 kV, an average IF of about 50 A, a reverse recovery time (trr) of about 300 nsec and a reverse recovery charge (Qrr) of about 1.6 μC when operating at a temperature of about 150° C.

19. The SiC PiN Diode of claim 18, wherein the n-type SiC drift layer defines a mesa, the SiC PiN Diode further comprising a guard ring termination structure in contact with the mesa.

20. The SiC PiN Diode of claim 18, wherein the VF is substantially stable during operation of the PiN Diode.

21. The SiC PiN Diode of claim 20, wherein a substantially stable VF during operation of the PiN Diode comprises a VF drift of about 0.1 V or less.

22. The SiC PiN Diode of claim 20, wherein a substantially stable VF during operation of the PiN Diode comprises a VF that is approximately the same from time zero to at least about 200 hours.

23. A Silicon Carbide (SiC) PiN Diode having a reverse blocking voltage (VR) from about 3.0 kV to about 6.5 kV and a forward voltage (VF) of less than about 4.0 V, wherein the SiC PiN Diode has an average forward current (IF) of less than about 420 A when operated at a temperature of between 25° C. and 530° C.,
wherein the SiC PiN Diode is a 10 kV, 4H—SiC PiN diode, the SiC PiN Diode further comprising:
a conducting n-type SiC substrate;
an n-type SiC drift layer on the substrate;
a p-type SiC Anode injection layer on the n-type drift layer, the p-type SiC Anode injection layer having first and second portions,
wherein the first portion on the drift layer is a p+ layer having a first carrier concentration;
wherein the second portion is a p++ layer having a second carrier concentration greater than the first carrier concentration; and
wherein the diode has a blocking voltage (VR) of about 10.0 kV, an average IF of about 50 A, a reverse recovery time (trr) of about 300 nsec and a reverse recovery charge (Qrr) of about 1.6 μC when operating at a temperature of about 150° C.

24. A Silicon Carbide (SiC) PiN Diode having a reverse blocking voltage (VR) of no less than 7.0 kV to 10.0 kV and a forward voltage (VF) of less than about 4.3 V,
wherein the SiC PiN Diode is a 10 kV, 4H—SiC PiN diode, the SiC PiN Diode further comprising:
a conducting n-type SiC substrate;
an n-type SiC drift layer on the substrate;
a p-type SiC Anode injection layer on the n-type drift layer, the p-type SiC Anode injection layer having first and second portions,
wherein the first portion on the drift layer is a p+ layer having a first carrier concentration;
wherein the second portion is a p++ layer having a carrier concentration greater than the first carrier concentration; and
wherein the diode has a blocking voltage (VR) of about 10.0 kV, an average IF of about 50 A, a reverse recovery time (trr) of about 300 nsec and a reverse recovery charge (Qrr) of about 1.6 μC when operating at a temperature of about 150° C.

25. A Silicon Carbide (SiC) Pin Diode having a reverse blocking voltage (VR) from about 3.0 kV to about 7.0 kV and a forward voltage (VF) of less than about 4.0 V, wherein the SiC PiN Diode has an average forward current (IF) of less than about 420 A when operated at a temperature of between 25° C. and 530° C.,
wherein the SiC PiN Diode is a 10 kV, 4H—SiC PiN diode, the SiC PiN Diode further comprising:
a conducting n-type SiC substrate;
an n-type SiC drift layer on the substrate;
a p-type SiC Anode injection layer on the n-type drift layer, the p-type SiC Anode injection layer having first and second portions,
wherein the first portion on the drift layer is a p+ layer having a first carrier concentration;
wherein the second portion is a p++ layer having a second carrier concentration greater than the first carrier concentration; and
wherein a blocking voltage (VR) of about 10.0 kV, an average IF of about 50 A, a reverse recovery time (trr) of about 300 nsec and a reverse recovery charge (Qrr) of about 1.6 μC when operating at a temperature of about 150° C.

26. A Silicon Carbide (SiC) PiN Diode having a reverse blocking voltage (VR) from about 3.0 kV to about 10.0 kV and a forward voltage (VF) of less than about 4.3 V, wherein the VF is substantially stable during operation of the PiN Diode and wherein the SiC PiN Diode has an average forward current (IF) of less than about 420 A when operated at a temperature of between 25° C. and 530° C., the SiC PiN Diode further comprising:
a reverse recovery time (trr) of between 150 nsec and 300 nsec and a reverse recovery charge (Qrr) of between 1.1 μC and 1.6 μC;
operating the SiC PiN Diode at a temperature of between 25° C. and 150° C., wherein a plurality of SiC PiN diodes are provided on a single chip, the chip being about 2.8 mm by 2.8 mm; and
wherein the chip has a total yield of no less than about forty three percent.

* * * * *